United States Patent
Ishikawa et al.

(10) Patent No.: US 6,447,651 B1
(45) Date of Patent: Sep. 10, 2002

(54) HIGH-PERMEABILITY MAGNETIC SHIELD FOR IMPROVED PROCESS UNIFORMITY IN NONMAGNETIZED PLASMA PROCESS CHAMBERS

(75) Inventors: Tetsuya Ishikawa; Kaveh Niazi; Tsutomu Tanaka, all of Santa Clara; Canfeng Lai, Fremont; Robert Duncan, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/800,798

(22) Filed: Mar. 7, 2001

(51) Int. Cl.$^7$ ............................................. C23C 14/35
(52) U.S. Cl. .............................. 204/192.1; 204/298.11; 204/298.16
(58) Field of Search .................................. 427/569, 585, 427/571; 204/192.1, 298.11, 298.16; 178/723 R

(56) References Cited

U.S. PATENT DOCUMENTS

| | | | |
|---|---|---|---|
| 4,892,753 A | 1/1990 | Wang et al. .................... 427/38 |
| 4,956,204 A | 9/1990 | Amazawa et al. ........... 427/248 |
| 5,000,113 A | 3/1991 | Wang et al. ................. 118/723 |
| 5,089,442 A | 2/1992 | Olmer ......................... 432/235 |
| 5,436,172 A | 7/1995 | Moslehi ......................... 437/8 |
| 5,494,854 A | 2/1996 | Jain ............................. 437/195 |
| 5,531,834 A | 7/1996 | Ishizuka et al. ........... 118/723 I |
| 5,626,922 A | 5/1997 | Miyanaga et al. .......... 427/535 |
| 5,648,175 A | 7/1997 | Russell et al. ............. 428/472.3 |
| 5,800,619 A | * 9/1998 | Holland et al. .............. 118/723 |
| 5,804,259 A | 9/1998 | Robles ......................... 427/577 |
| 5,897,712 A | * 4/1999 | Hanawa et al. ................ 216/68 |
| 5,937,323 A | 8/1999 | Orczyk et al. ............... 438/624 |
| 5,944,902 A | 8/1999 | Redeker et al. ........ 118/723 AN |
| 5,968,610 A | 10/1999 | Liu et al. ..................... 427/579 |

FOREIGN PATENT DOCUMENTS

EP         0 520 519 A1    6/1992    ............ H01J/37/32

OTHER PUBLICATIONS

N. Hayasaka et al., "High–Quality and Low Dielectric Constant CiO2 CVD Using High Density Plasma," 1993 Dry Process Symposium.

Gyeong S. Hwang et al., "Modeling of charging damage during interlevel oxide deposition in high–density plasmas," 1998 American Institute of Physics, vol. 84, No. 1.

Wei Lu, et al., "Characterization of High Density Plasma CVD USG Film," SPIE vol. 3214.

L. Q. Qian et al., "High Density Plasma Deposition and Deep Submicron Gap Fill with Low Dielectric Constant SIOF Films," DUMIC Conference, Feb. 21–22, 1995.

P. Weigand et al., "High Density Plasma CVD oxide deposition: the effect of sputtering on the film properties," VMIC Conference, Jun. 18–20, 1996, 1996 ISMIC.

* cited by examiner

Primary Examiner—Steven H. VerSteeg
(74) Attorney, Agent, or Firm—Townsend & Townsend & Crew

(57) ABSTRACT

A method and apparatus for forming a layer on a substrate in a process chamber during a plasma deposition process are provided. A plasma is formed in a process chamber, a process gas with precursor gases suitable for depositing the layer are flowed into the process chamber, and a magnetic field having a strength less than about 0.5 gauss is attenuated within the process chamber. Attenuation of such a magnetic field results in an improvement in the degree of process uniformity achieved during the deposition.

24 Claims, 5 Drawing Sheets

HIGH-PERMEABILITY MAGNETIC SHIELD FOR IMPROVED PROCESS UNIFORMITY IN NONMAGNETIZED PLASMA PROCESS CHAMBERS

BACKGROUND OF THE INVENTION

The present invention relates to the manufacture of integrated circuits on a substrate. More particularly, the invention relates to a method and apparatus for improving the process uniformity of plasma processing techniques used in such manufacture.

One of the primary steps in the fabrication of modern semiconductor devices is the formation of a thin film on a semiconductor substrate by chemical reaction of gases. Such a deposition process is referred to generally as chemical vapor deposition ("CVD"). Conventional thermal CVD processes supply reactive gases to the substrate surface where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

Any of these CVD techniques may be used to deposit conductive or insulative films as necessary during the fabrication of integrated circuits. It is generally desirable that the process for depositing such a film be uniform in all respects. Recently, there has been an economically motivated trend to increase the size of circular semiconductor wafers used in such CVD applications. Currently, wafers with diameters up to 300 mm are being used, up from about 200 mm in the recent past. While the increase in wafer diameter is economically advantageous, it also tends to increase the degree of nonuniformity introduced during deposition procedures. The effects of such nonuniformity are especially noticeable when larger wafers are used because the total wafer area varies as the square of its diameter. In particular, it has been observed that the sputter nonuniformity in an HDP-CVD process is significantly greater when the process is performed on a 300-mm wafer when compared with the process performed on a 200-mm wafer. Indications suggest that if economic considerations push towards the use of even larger wafers, the effects of sputter nonuniformity will be even greater.

Accordingly, it is desirable to have a method and apparatus that will generally improve process uniformity, particularly when larger-sized wafers are to be used.

SUMMARY OF THE INVENTION

The inventors have discovered that sputter nonuniformity in plasma deposition processes is affected by magnetic fields on the order of the geomagnetic field of 0.5 gauss or less. This field can be caused by permanent magnets in the vicinity of a deposition chamber or by the earth itself. One factor in the sputter nonuniformity is believed to result from impacts from electrons in the plasma. As wafer sizes increase so that the diameters exceed the order of the mean cyclotron radius of such electrons, the effect from this factor is enhanced. Since the electron cyclotron radius is inversely proportional to the strength of the ambient magnetic field, attenuation of a magnetic field having a strength less than about 0.5 gauss within the process chamber results in an increase in the cyclotron radius of the electrons, with a concomitant decrease in the degree of sputter nonuniformity. Accordingly, in a first embodiment of the invention, a method is provided for forming a layer on a substrate during a plasma deposition process by forming a plasma in a process chamber, flowing suitable deposition precursor gases into the process chamber, and limiting sputter nonuniformity by attenuating a magnetic field having a strength less than about 0.5 gauss within the process chamber.

In specific embodiments of the invention, the attenuation of such a magnetic field is achieved with a magnetic shield positioned to enclose at least a portion of the process chamber. In some of these embodiments, the permeability of the magnetic shield is greater than $10^4$ times the permeability of free space. In one specific embodiment, an appropriate material for the magnetic shield that achieves the desired permeability comprises greater than 75 at. % nickel and greater than 12 at. % iron; it preferably also comprises greater than 4 at. % molybdenum.

The methods of the present invention may be used with a substrate processing system. Such a substrate processing system includes a nonmagnetized substrate processing chamber and a plasma-generating system operatively coupled to the processing chamber to generate a plasma within the substrate processing chamber. A magnetic shield is configured to enclose at least a portion of the process chamber for limiting sputter nonuniformity by attenuating a magnetic field having a strength less than about 0.5 gauss within the process chamber.

A further understanding of the nature and advantages of the present invention may be realized by reference to the remaining portions of the specification and the drawings.

DESCRIPTION OF THE SPECIFIC EMBODIMENTS

I. INTRODUCTION

Embodiments of the present invention are directed to a method and apparatus for improving the process uniformity during plasma CVD deposition processes. By enclosing the plasma chamber with a shield constructed from a high-magnetic-permeability material, a substantial improvement in process uniformity, particularly in sputter uniformity, is achieved. As explained in detail below, attenuation of magnetic fields on the order of 0.5 gauss or less within the process chamber reduces the sputter nonuniformity, leading to a general improvement in deposition characteristics.

II. EXEMPLARY SUBSTRATE PROCESSING SYSTEM

Figure 1A:
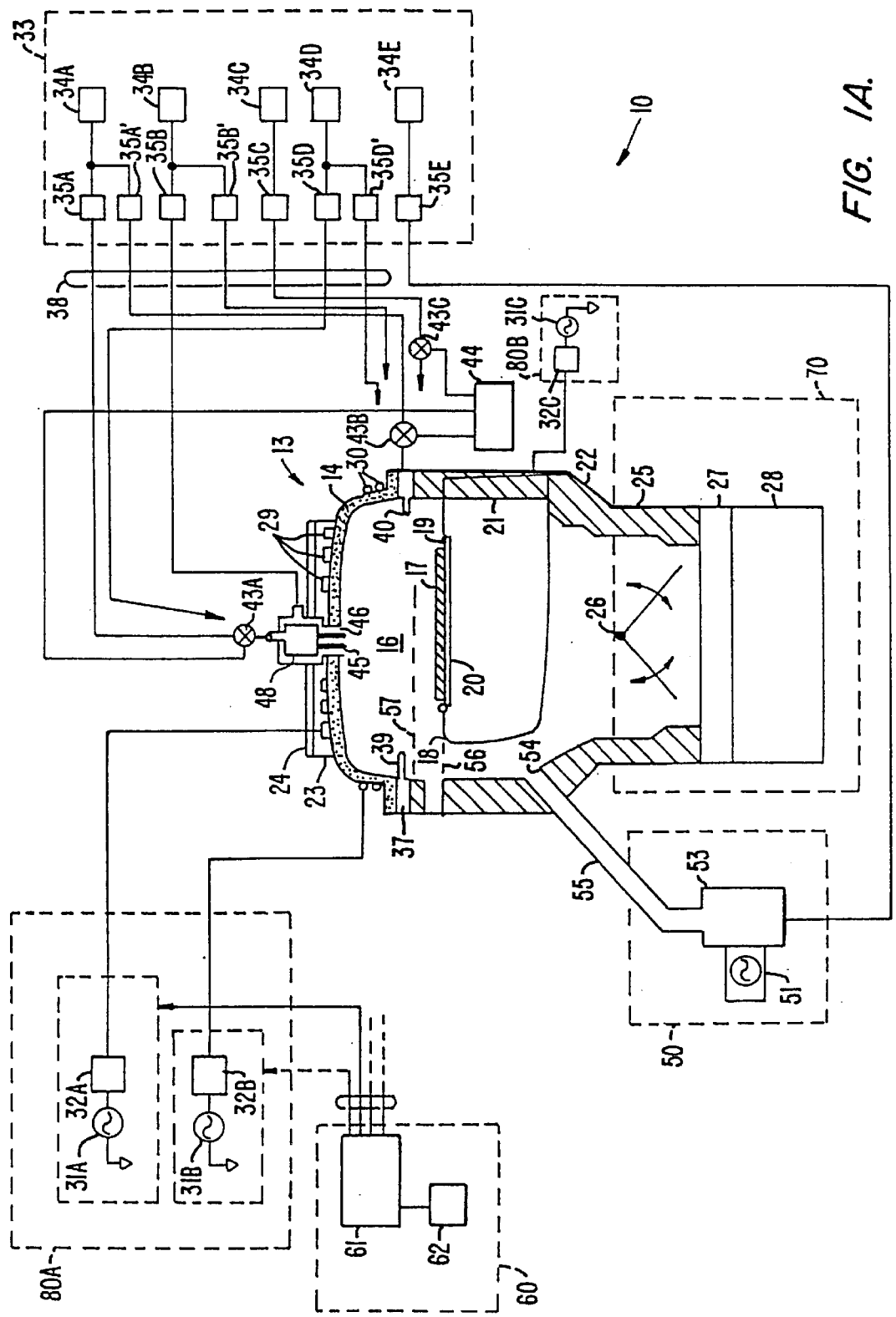
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
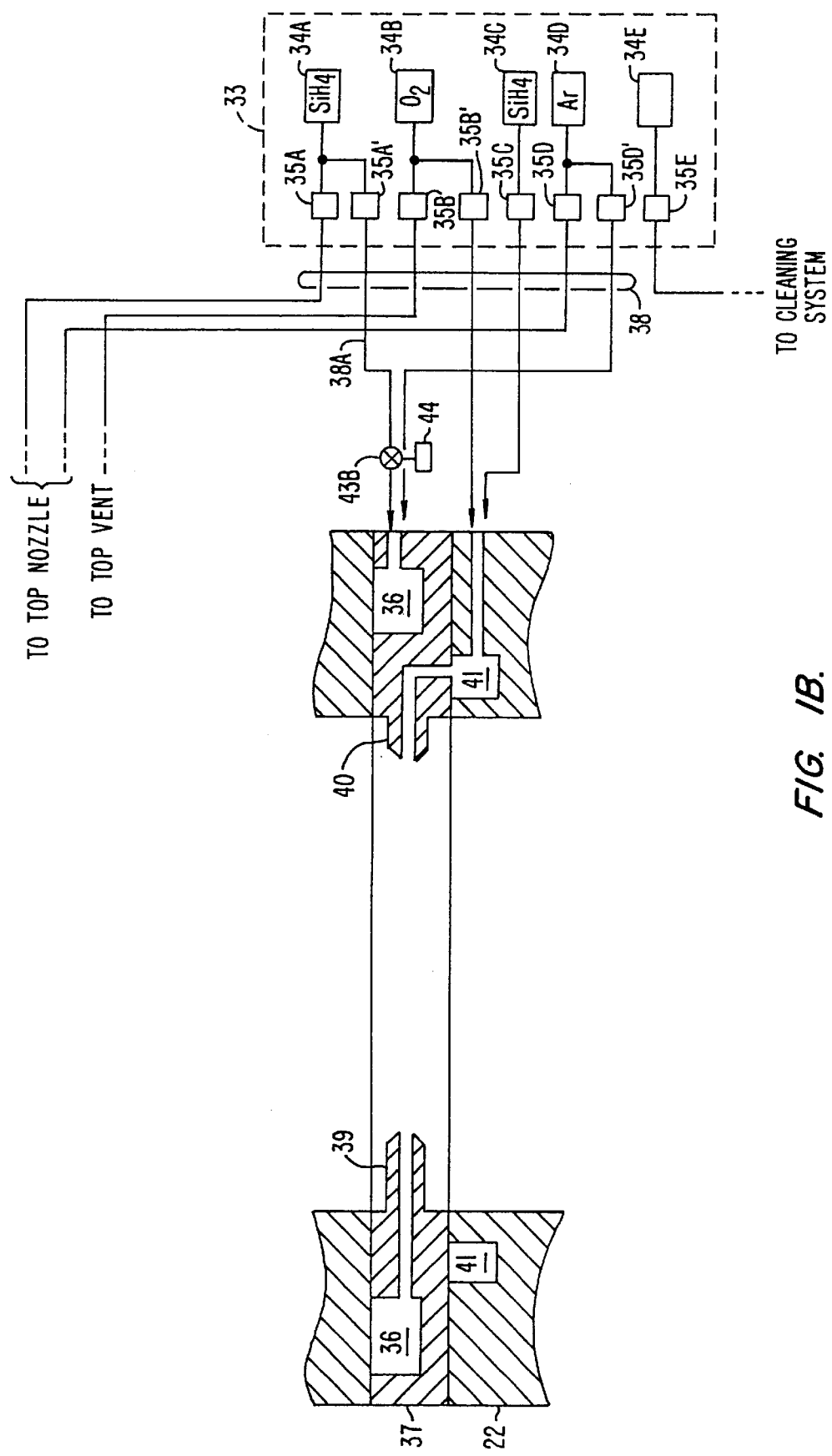
FIG. 1B is a simplified cross section of a gas ring that may be used in conjunction with the exemplary CVD processing chamber of FIG. 1A.

A gas delivery system 33 provides gases from several sources 34A–34E for processing the substrate via gas delivery lines 38 (only some of which are shown). As would be understood by a person of skill in the art, the actual sources used for sources 34A–34E and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B; two MFCs 35D and 35D' may be used to control the flow of the gas provided by source 34D to source gas nozzles 39 and top gas nozzle 45. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) received through MFC 35E in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 60 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
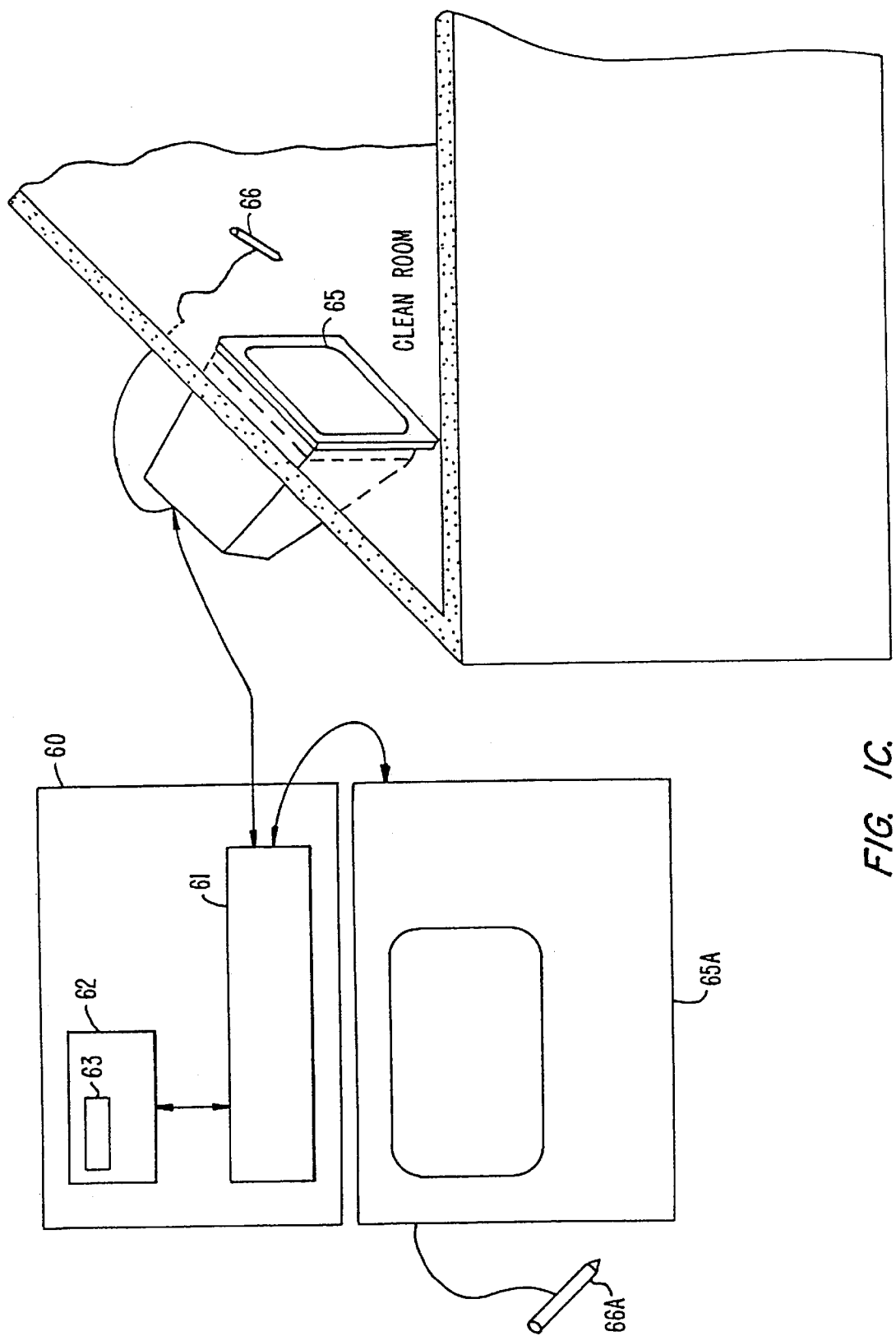
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
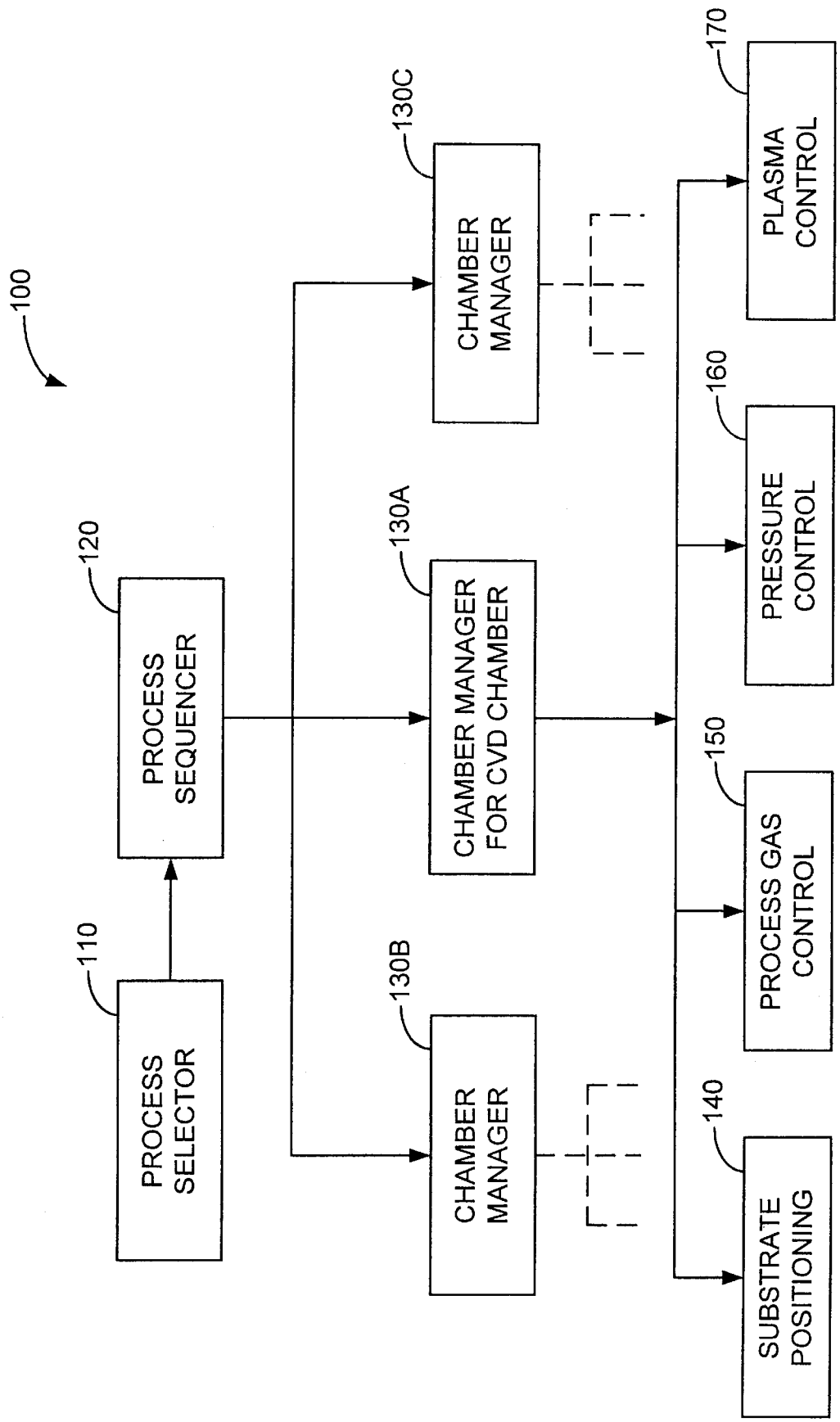
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 1 30A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multi-chamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 170, like the previously described chamber component subroutines, is invoked by chamber manager subroutine 130A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. MAGNETIC SHIELDING

In response to recent trends towards the use of larger semiconductor wafers, the inventors were tasked with developing deposition processes for chambers to accommodate 300-mm wafers. During this development for plasma-based processes, the inventors were faced with unexpectedly large film uniformity problems. Such problems were encountered independent of the material being deposited and were observed, for example, when depositing undoped silicate glass (USG) or fluorinate silicate glass (FSG).

Over a period of time, various approaches that had been successful in improving the process uniformity for 200-mm wafers were attempted, including adjusting the deposition parameters and bias characteristics of the process. While various of these approaches had some effect, they generally affected the process uniformity only to the degree expected from previous experience with 200-mm wafers and were unable to correct the anomalous nonuniformity seen with 300-mm wafers. After excluding these various approaches, the inventors hypothesized that the presence of a spurious magnetic field might be adversely affecting the process characteristics. They therefore sought to confirm this hypothesis by removing magnetic sources from the vicinity of the process 300-mm process chamber, such magnetic sources generally having a field strength greater than about 0.5 gauss, which is of the order of the geomagnetic field. Even after carefully excluding magnetic sources potentially having producing fields greater than about 0.5 gauss, however, the anomalous nonuniformity nevertheless persisted.

After further effort, the inventors therefore theorized that the anomaly might arise from a magnetic source having a field strength less than about 0.5 gauss. For the reasons expressed below on the basis of processing smaller wafers, such field strengths were believed to be sufficiently small not to have a significant effect on process characteristics. It was further hypothesized that the anomaly might result from an ambient magnetic field that could not be excluded by removing specific field sources from the area of the 300-mm process chamber. In order to test these theories, magnetic shielding was use to isolate the process chamber 13 even from an ambient magnetic field and produced a substantial improvement, sufficient to account for the anomalous nonuniformity. The use of magnetic shielding on plasma deposition chambers had previously been restricted to reducing the effect of purely local magnetic fields produced by known permanent magnets having field strengths greater than about 0.5 gauss in the vicinity of the process chamber 13. The inventors' discovery is that, even in the absence of locally induced magnetic fields with such strengths, process uniformity is improved by configuring a high-magnetic-permeability shield around a nonmagnetic process chamber. This suggests that the spurious nonuniformity is manifested with 300-mm wafers for smaller fields than was the case for smaller-diameter wafers. These field strengths may be caused by permanent magnets in the vicinity of the chamber or by the earth itself.

There are several subsequently developed experimental and theoretical considerations that support this hypothesis. During a plasma deposition process, sputter nonuniformity during the deposition of a layer on a substrate arises from impacts by electrons in the plasma. The cyclotron radius for an electron moving in a magnetic field with strength B is given by $r_{cyc}=mv/eB$, where m and e are the electron mass and charge, and v is the electron's velocity. Under normal deposition conditions for the plasma chamber 13 described above, the plasma species includes a mixture of electrons and ionic particles, each of which has an energy distribution. Electrons with a mean expected kinetic energy on the order of 5 eV thus have a cyclotron radius on the order of 100 mm when the field strength is on the order of 0.5 gauss.

It is thus evident that while the effect on process uniformity of fields having a strength on the order of 0.5 gauss or less should be small for wafers with a diameter less than this cyclotron radius (i.e. for $d_{wafer} \leq 100$ mm), the effect is increased for wafers with larger diameters. It is believed this is why the process exhibited significant nonuniformity for 300-mm wafers, but was not previously recognized for the smaller 100-mm and 200-mm wafers. The ionic particles in the plasma have a much larger mass than the electrons, and their cyclotron radius is therefore expected to be thousands of times larger. As a result, they have little effect on the sputter uniformity. While the above description of the sputter nonuniformity mechanism has focussed on high-density plasma deposition, for which "high density" is understood to refer to a plasma with an ion density exceeding $10^{11}$ ions/cm$^3$, the result that the sputter nonuniformity mechanism is dominated by electron activity is generally applicable to any plasma deposition process.

This mechanism has been confirmed qualitatively with experiments in which a small magnetization was deliberately introduced to the plasma. The introduction of a magnetization that corresponds to what would result from field strengths on the order of 0.5 gauss was observed to produce noticeable effects on sputtering uniformity when depositing layers on 300-mm wafers in an HDP-CVD process chamber. With careful observation, the effect could also be seen when depositing layers on 200-mm wafers, but was significantly smaller. It is thus apparent that the influence of magnetic fields less than about 0.5 gauss should be addressed in order to maintain desired process uniformity characteristics as wafer sizes are increased above 200 mm. In terms of the sputter mechanism described above, attenuation of such small fields results in an increase in the cyclotron radius of the plasma electrons. When the mean electron cyclotron radius approximately exceeds the wafer diameter, the sputter nonuniformity decreases.

In one embodiment of the invention, attenuation of fields less than 0.5 gauss within the process chamber 13 is achieved by shielding the nonmagnetic process chamber 13 with high-magnetic-permeability $\mu$ sheet metal. The magnetic permeability of a metal is understood to refer to the ratio of magnetic flux induced in the metal to the strength of the magnetic field that induces that flux. Accordingly, a shield's high permeability ensures that magnetic flux will be concentrated in the shield rather than within the nonmagnetic process chamber 13, thereby achieving the desired attenuation. The shielding enclosure is preferably constructed to surround as much of the process chamber 13 as possible, but outside of any RF and/or ground shields that may be used as part of the substrate processing system 10, so as not to affect the RF fields within the chamber. As discussed below, the most effective shielding is one that encloses as much of the process chamber 13 as possible, but partial shields have also been observed to have a favorable effect on the process uniformity.

When a high-$\mu$ material is placed in a magnetic field, the local magnetic flux is diverted to the material, causing the desired reduction in field strength. Because the extent to which flux is diverted is proportional to the permeability of the material, continually greater improvement in shielding results with an increase in the permeability of the shielding material. Materials that have suitably high permeabilities to shield the process chamber 13 from the magnetic fields on the order of 0.5 gauss or less include MUMETAL®, HIPERNOM®, CARPENTER HyMu-80®, and PERMALLOY®, although any material with an appropriately high permeability may be used. Each of these four commercially available materials is a soft alloy that has a permeability relative to the permeability of free space on the order of $10^4$–$10^6$; they comprise approximately 80 at. % Ni and 15 at. % Fe, and are balanced primarily with transition elements such as copper, molybdenum, or chromium, depending on the specific recipe used. For example, MUMETAL® consists of 77 at. % Ni, 14 at. % Fe, 5 at. % Cu, and 4 at. % Mo. It has a magnetic permeability between approximately $6.0 \times 10^4$ and $2.4 \times 10^5$, depending on the frequency of the magnetic field in which it is placed. The CARPENTER HyMu-80® alloy consists of 80 at. % Ni, 15 at. % Fe, 4.2 at. % Mo, 0.5 at. % Mn, 0.35 at. % Si, and 0.02 at. % C. PERMALLOY® consists of 78 at. % Ni, 16.6 at. % Fe, 4.8 at. % Mo, and 0.9 at. % Mn.

As will be appreciated by those of skill in the art, such shielding materials are substantially different from ground or RF shields that may also be used within the substrate processing system 10. RF shielding is used to block high-frequency ($\geq$100 kHz) interference fields. Such shields are typically constructed of copper, aluminum, galvanized steel, or conductive rubber, plastic, or paints. The high electrical conductivity of such materials, with small (~1) permeabilities, makes them suitable for blocking electromagnetic signals at high frequency. Accordingly, by positioning the high-permeability shield outside of RF and/or ground shields, the operation of the substrate processing system 10 is not impeded in any way as a result of field attenuation from external or ambient fields having a strength $\leq$0.5 gauss.

Experimental observations of 300-mm wafers deposited with layers while high-permeability magnetic shielding is in place confirm directly that the sputter nonuniformity is decreased. Careful observations of deposited 200-mm wafers also reveal a beneficial effect from the shielding, although, as expected, the effect is less significant than for the larger wafers. In constructing the high-permeability shield, it is preferable to use a shielding configuration that affords a complete path for the field lines; otherwise there is the possibility that the field lines will exit the material in a place where they will cause unintended and undesirable interference with the operation of the substrate processing system 10. The shape and configuration of the substrate processing system 10 may impose limitations on the extent to which the process chamber 13 can be enclosed by the magnetic shield, but in order to attenuate the fields less than about 0.5 gauss as much as possible, it is preferable to enclose as much of the process chamber 13 as practicable. Less attenuation of such fields permits more plasma electrons at the low end of their energy distribution to have a sufficiently small cyclotron radius to affect sputter uniformity. Even if the configuration of the substrate processing system 10 prevents complete enclosure of the process chamber 13, however, partial shielding is still observed to have a favorable effect on process uniformity because it limits the portion of the plasma electron energy distribution that can have an effect.

Figure 2:
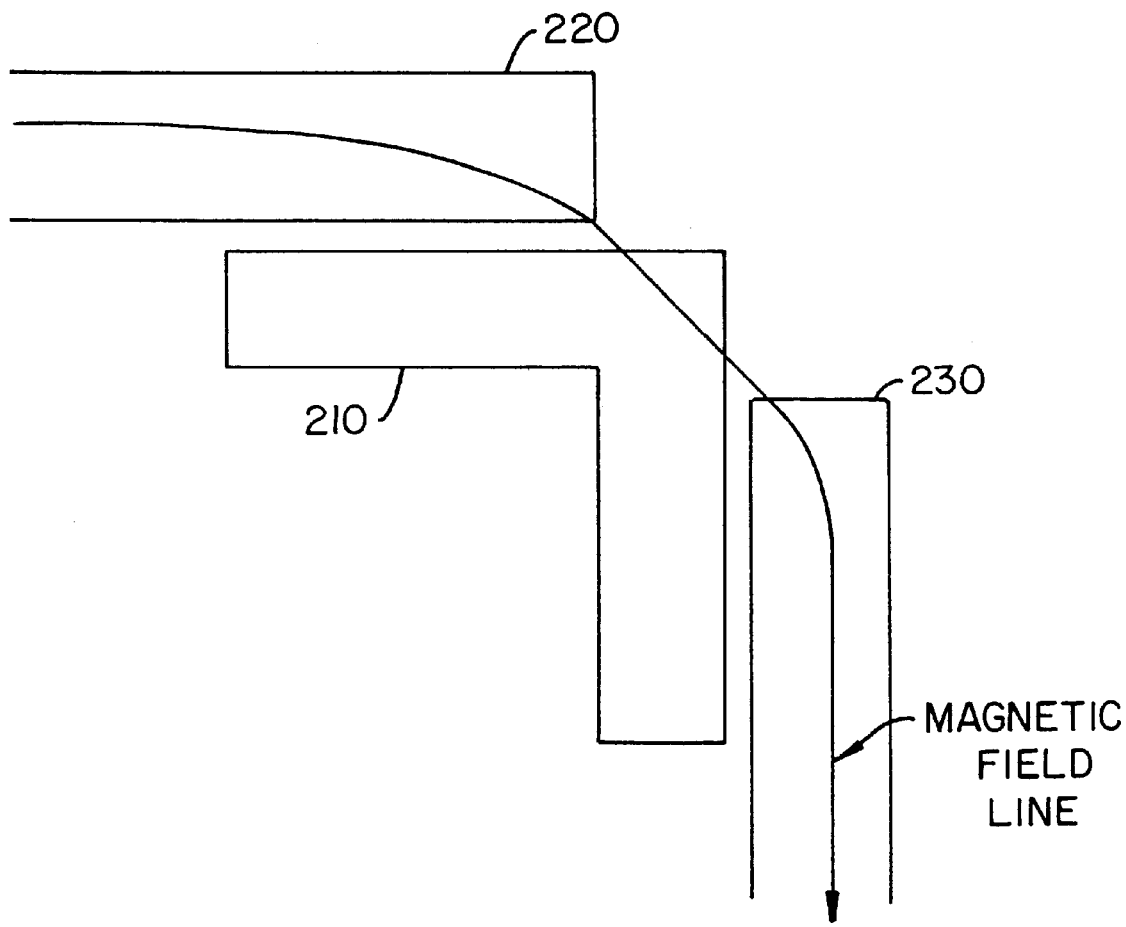
FIG. 2 shows a cross-sectional view of one embodiment of the invention in which the magnetic flux leakage of a high-permeability magnetic shield is minimized.

An effective shield that limits the escape of flux can be formed by joining plates of the high-permeability material tightly, minimizing gaps between the plates. One useful configuration is illustrated in FIG. 2. A small angled piece 210 of high-permeability material is positioned to ensure that joined plates 220 and 230 have some overlap. Such positioning helps ensure that the magnetic field lines will not leak to the space enclosed by the shield. The possibility of such undesirable leakage is further decreased by welding the plates 220 and 230 to the angled piece 210.

Those of ordinary skill in the art will realize that the material used to shield the process chamber may have different compositions and may be configured differently without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for forming a layer on a substrate in a nonmagnetized process chamber during a plasma deposition process, the method comprising:
   (a) forming a plasma in the process chamber;
   (b) flowing a process gas suitable for depositing the layer on the substrate into the process chamber; and
   (c) limiting sputter nonuniformity by attenuating a magnetic field having a strength less than about 0.5 gauss within the process chamber with a magnetic shield that at least partially encloses the process chamber.

2. The method according to claim 1 wherein the plasma is a high-density plasma.

3. The method according to claim 1 wherein the substrate is a circular wafer with a diameter greater than 200 mm.

4. The method according to claim 3 wherein the diameter of the circular wafer is substantially equal to 300 mm.

5. The method according to claim 1 wherein the magnetic shield has a magnetic permeability greater than $10^4$ times the magnetic permeability of free space.

6. The method according to claim 1 wherein the magnetic shield comprises greater than 75 at. % Ni and greater than 12 at. % Fe.

7. The method according to claim 6 wherein the magnetic shield further comprises greater than 4 at. % Mo.

8. The method according to claim 1 wherein the magnetic shield encloses substantially all of the process chamber.

9. The method according to claim 1 wherein the magnetic field is a geomagnetic field.

10. A method for forming a layer on a circular wafer having a diameter greater than 200 mm in a nonmagnetized process chamber during a high-density-plasma deposition process, the method comprising:

(a) forming a plasma in the process chamber;

(b) flowing a process gas suitable for depositing the layer on the substrate into the process chamber; and (c) limiting sputter nonuniformity by attenuating a magnetic field having a strength less than about 0.5 gauss within the process chamber with a magnetic shield having a magnetic permeability greater than $10^4$ times the magnetic permeability of free space.

11. The method according to claim 10 wherein the magnetic shield comprises greater than 75 at. % Ni, greater than 12 at. % Fe, and greater than 4 at. % Mo.

12. The method according to claim 10 wherein the diameter of the circular wafer is approximately 300 mm or greater.

13. The method according to claim 10 wherein the magnetic field is a geomagnetic field.

14. A substrate processing system comprising:

(a) a nonmagnetized substrate processing chamber;

(b) a plasma-generating system operatively coupled to the processing chamber to generate a plasma within the substrate processing chamber; and (c) a magnetic shield configured to enclose at least a portion of the process chamber for limiting sputter nonuniformity by attenuating a magnetic field having a field strength less than about 0.5 gauss within the process chamber.

15. The substrate processing system according to claim 14 wherein the substrate processing chamber is sized and configured to hold a circular wafer with a diameter greater than 200 mm.

16. The substrate processing system according to claim 15 wherein the substrate processing chamber is sized and configured to hold a circular wafer with a diameter substantially equal to 300 mm.

17. The substrate processing system according to claim 14 wherein the plasma is a high-density plasma.

18. The substrate processing system according to claim 14 wherein the magnetic shield has a magnetic permeability greater than $10^4$ times the magnetic permeability of flee space.

19. The substrate processing system according to claim 14 wherein the magnetic shield comprises greater than 75 at. % Ni and greater than 12 at. % Fe.

20. The substrate processing system according to claim 19 wherein the magnetic shield further comprises greater than 4 at. % Mo.

21. The substrate processing system according to claim 14 wherein the magnetic shield encloses substantially all of the process chamber.

22. A substrate processing system comprising:

(a) a nonmagnetized substrate processing chamber sized and configured to hold a circular wafer having a diameter greater than 200 mm;

(b) a high-density plasma generating system operatively coupled to the processing chamber to generate a plasma within the substrate processing chamber; and (c) a magnetic shield having a magnetic permeability greater than $10^4$ times the magnetic permeability of free space and configured to enclose at least a portion of the process chamber for limiting sputter nonuniformity by attenuating a magnetic field having a field strength less than about 0.5 gauss within the process chamber.

23. The substrate processing system according to claim 22 wherein the magnetic shield comprises greater than 75 at. % Ni, greater than 12 at. % Fe, and greater than 4 at. % Mo.

24. The substrate processing system according to claim 22 wherein the diameter of the circular wafer is approximately 300 mm or greater.

* * * * *